United States Patent [19]
Yoon

[11] Patent Number: 6,009,134
[45] Date of Patent: Dec. 28, 1999

[54] TIMING RESTORATION CIRCUIT FOR PULSE AMPLITUDE MODULATION (PAM)-TYPE COMMUNICATION SYSTEM

[75] Inventor: Young Bin Yoon, Kyungki-Do, Rep. of Korea

[73] Assignee: LG Semicon Co., Ltd., Choongcheongbuk-Do, Rep. of Korea

[21] Appl. No.: 08/920,009

[22] Filed: Aug. 29, 1997

[30] Foreign Application Priority Data

Sep. 2, 1996 [KR] Rep. of Korea ................. 96/37810

[51] Int. Cl.$^6$ ............................................. H03D 3/24
[52] U.S. Cl. ................................. 375/376; 375/355
[58] Field of Search ............................. 375/371, 376, 375/355, 260; 370/517, 518, 503; 327/153, 141, 152, 158, 159

[56] References Cited

U.S. PATENT DOCUMENTS

| | | | |
|---|---|---|---|
| 4,841,551 | 6/1989 | Avaneas | 375/371 |
| 5,068,628 | 11/1991 | Ghoshal | 331/1 A |
| 5,415,172 | 5/1995 | Tannaka et al. | 600/437 |
| 5,886,552 | 3/1999 | Chai et al. | 375/359 |

*Primary Examiner*—Tesfaldet Bocure
*Attorney, Agent, or Firm*—Morgan, Lewis & Bockius LLP

[57] ABSTRACT

A timing restoration circuit for a pulse amplitude modulation (PAM)-type communication system which is capable of effectively preventing interference between a plurality of receiving devices caused by phase locked loops (PLL) being disposed in one chip when a plurality of channels are employed. The PAM type communication system includes a logical operator and comparator for logically operating and comparing signals sequentially delayed in a single PLL with the received signal of each channel. The system then generates a selective control signal for selecting a signal from among the sequentially delayed signals closest to a timing of the received signal, and multiplexers are utilized for selecting the signals from among the output signals from the PLL closest to the timing of the received signals on the basis of the selective control signals outputted from the logical operator and comparator and outputting the selected signal as sampling pulse signals of each channel.

13 Claims, 7 Drawing Sheets

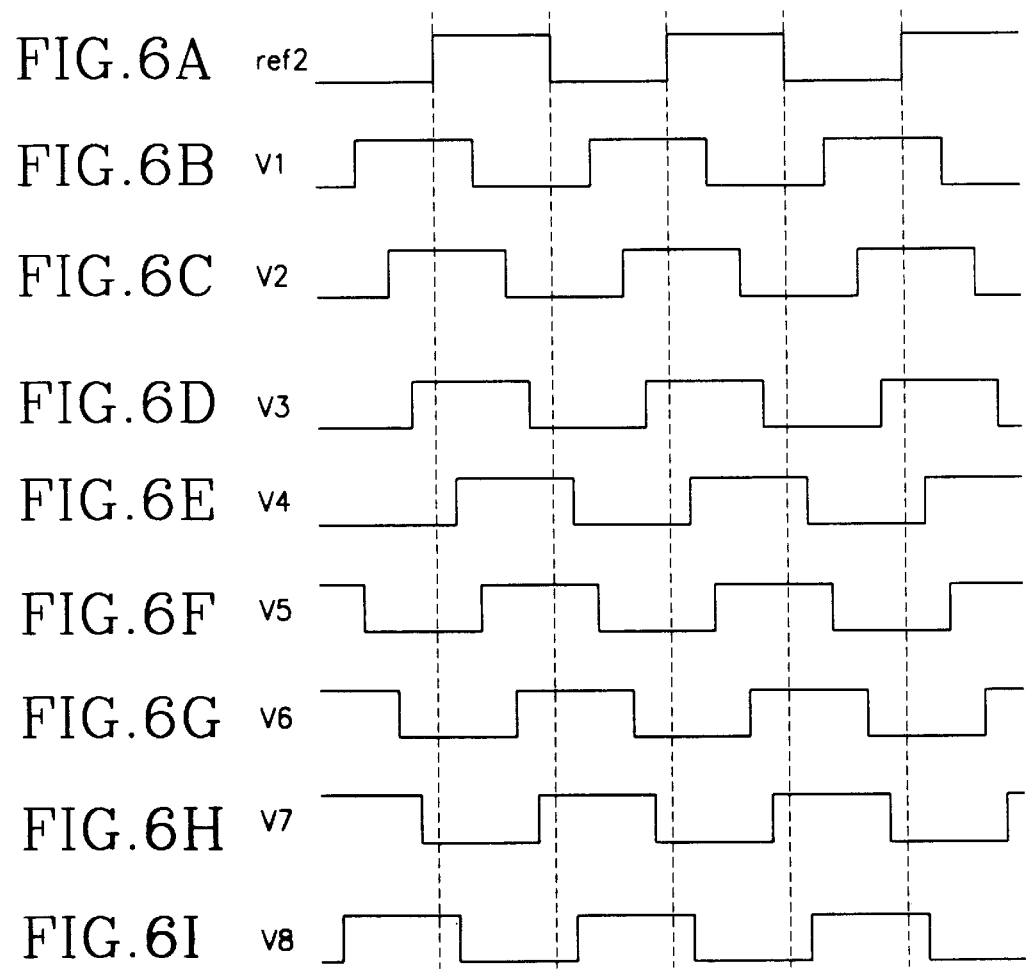

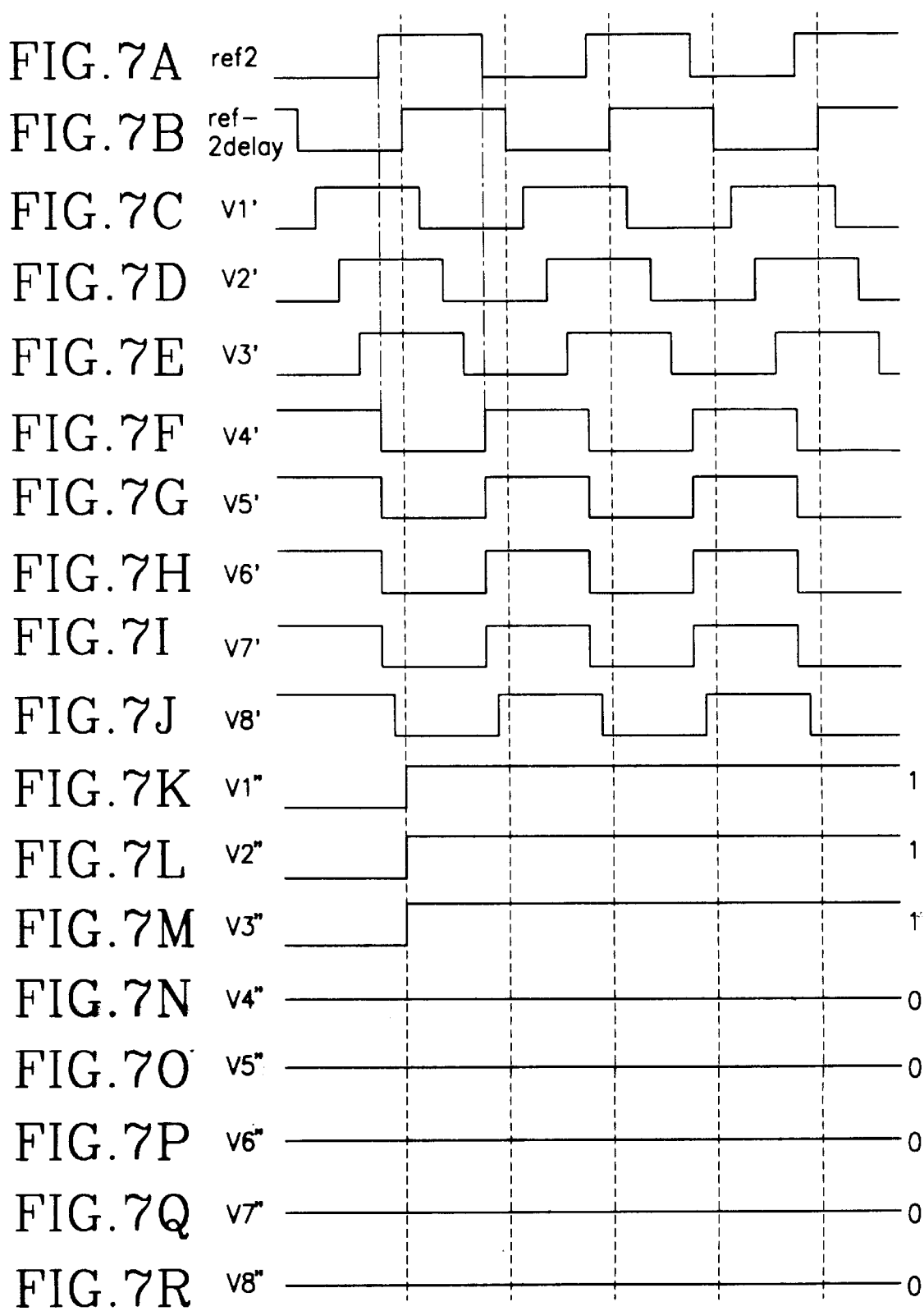

TIMING RESTORATION CIRCUIT FOR PULSE AMPLITUDE MODULATION (PAM)-TYPE COMMUNICATION SYSTEM

This application claims the benefit of Korean Patent Application No. 37810/1996, filed Sep. 2, 1996, which is hereby incorporated by reference.

BACKGROUND OF THE INVENTION

1. Field of the Invention

The present invention relates to a timing restoration circuit in a pulse amplitude modulation-type (hereinafter, called PAM-type) communication system, and more particularly, to an improved PAM-type timing restoration circuit which is capable of effectively preventing interference between a plurality of receiving devices caused by a plurality of phase locked loops (hereinafter, called PLL) disposed in one chip when a plurality of channels are employed.

2. Description of the Prior Art

FIG. 1 is a schematic block diagram for a band-based PAM-type communication system according to the conventional art. As shown in this drawing, the PALM-type communication system includes a pulse amplitude modulator 1 for pulse amplitude modulating an input signal (ak) and outputting the modulated signal as an analog signal s(t) to a transmission channel 2. An A/D converter 3 located on a receiving side of the channel 2 converts an analog signal r(t) transmitted through the channel 2 into a digital signal. A PLL 4 detects the phase of an output signal r(d) from the A/D converter 3 and to restore timing and varies an oscillating frequency fed back to the A/D converter 3 depending on the phase difference. An equalizer 5 receives the output signal r(d) from the A/D converter and removes noise generated in channel 2. A slicer 6 receives an output signal from the equalizer 5 and converts the signal into a signal âk identically-shaped to a signal from the transmission side.

FIG. 2 is a schematic block diagram for a band-based PAM-type communication system having a plurality of channels. As shown in this drawing, N communication systems shown in FIG. 1 are connected in parallel on each channel, and output signals ($\hat{b}^1 k$–$\hat{b}''k$) from each communicating system are aligned through a parallel/serial converter 27 to be outputted as serial signals ($\hat{Q}k$).

As shown in FIG. 1, the pulse amplitude modulator 1 on the transmission side pulse amplitude modulates an input signal (ak) to output an analog signal s(t), and on the receiving side, a signal r(t) inputted through the channel 2 is sampled as a digital signal r(d) through the A/D converter 3. Meanwhile, on the receiving side, to obtain a sampling signal of precise timing, the output signal r(d) from the A/D converter 3 is transmitted through the PLL 4 which serves as a timing restoration circuit and fed-back to the A/D converter 3.

Description will now be given of the operation of the PLL 4, referring to FIG. 3.

A phase/frequency detector 31A (hereinafter, called PFD) detects a phase/frequency difference between the output signal r(d) from the A/D converter 3 and the output signal of a voltage controlled oscillator (VCO) 34A, and a charge pump 32A pumps charge corresponding to the value of the detected phase/frequency difference (errors signal), where the level of a voltage corresponding to the phase/frequency difference is outputted from the charge pump and the noise in the voltage is eliminated by a loop filter 33A to be supplied to the VCO 34A. The VCO 34A outputs a signal having a frequency corresponding to the output of the loop filter 33A as an input to the phase/frequency detector 31A.

The above-described operation of phase/frequency detection and correction is repeatedly performed until a phase/frequency difference disappears.

Furthermore, after the noise generated in the channel is eliminated from the signal, r(d) is sampled through the A/D converter 3, r(d) passes through the equalizer 5 and a signal (âk) identically-shaped to the one from the transmission side is outputted through the slicer 6.

A band-based PAM-type communication system having one channel is evident, for example, from the above description. In the case of the band-based PAM-type communication system having N channels, as shown in FIG. 2, each communicating system is connected in parallel, respectively, and the paralleled signals ($\hat{b}^1 k$–$\hat{b}''k$) are aligned through the parallel/serial converter 27 to be outputted as a series signals ($\hat{Q}k$).

Here, since the band-based PAM-type communication system having N channels requires N PLLs 24A–24N, and N VCOs 32A–32N, as shown in FIG. 3, are used. The VCOs 32A–32N operate at the same frequency, resulting in the generation of interference among each other.

As described above, in embodying the conventional communicating system having a plurality of channels, VCOs using the same frequency are disposed in each PLL, causing interference between the VCOs, which prevents the PLLs from carrying out a normal locking operation and as a result from performing a normal timing restoration.

SUMMARY OF THE INVENTION

Accordingly, an object of the present invention is an improved timing restoration circuit for a PAM-type communication system which is capable of performing timing restoration with one VCO, a plurality of logical operators and comparators corresponding to the number of channels, and a multiplexer in embodying a PAM-type communication system having N channels.

To achieve the above and objects, in a pulse amplitude modulation (PAM) type communication system having N communication channels through which are respectively received signals $r^1(t)$–$r^N(t)$ which are in turn analog-to-digital (A/D) converted at a receiving side to yield respective corresponding first to Nth channel signals $ref_1$–$ref_N$, a timing restoration circuit includes phase locked loop (PLL) means for receiving a first channel signal $ref_1$, for generating a oscillatory signal $V_1$ corresponding in phase and frequency with the first channel signal $ref_1$, for outputting the signal $V_1$ as a sampling pulse signal $\emptyset_1$ of the first channel, and for sequentially delaying the signal $V_1$ for predetermined times to generate and output a plurality of respective sequentially delayed oscillatory signals $V_2$–$V_N$, and a plurality of pulse output sampling means for respectively outputting sampling pulse signals $\emptyset_2$–$\emptyset_N$ of the second through Nth channels, each of the sampling pulse output means including logical operator and comparator means for logically operating and comparing each of the second through Nth channel signals $ref_2$–$ref_N$ with each of the oscillatory signals $V_1$–$V_N$ outputted from the PLL means and generating selective control signals $V_1''$–$V_N''$ which is closest in timing to each of +he respective second through Nth channel signals $ref_2$–$ref_N$, and outputting the selected signals as the sampling pulse signals $\emptyset_2$–$\emptyset_N$ of the second through Nth channels, respectively.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 6A through 6I are waveform diagrams of a received signal and output signals, wherein FIG. 6A is a waveform diagram of a received signal in the circuit of FIG. 4 and FIGS. 6B through 6I are waveform diagrams of output signals from a VCO in the circuit of FIG. 4; and FIGS. 7A through 7R are waveform diagrams of received signals and output signals, wherein FIG. 7A is a waveform diagram of a received signal in the circuit of FIG. 4, FIG. 7B is a waveform diagram of a delayed received signal, FIGS. 7C through 7J are waveform diagrams of output signals from flip-flops and FIGS. 7K through 7R are waveform diagrams of output signals from other flip-flops.

DETAILED DESCRIPTION OF THE INVENTION

Description will now be given of the present invention with reference to the accompanying drawings.

Figure 1:
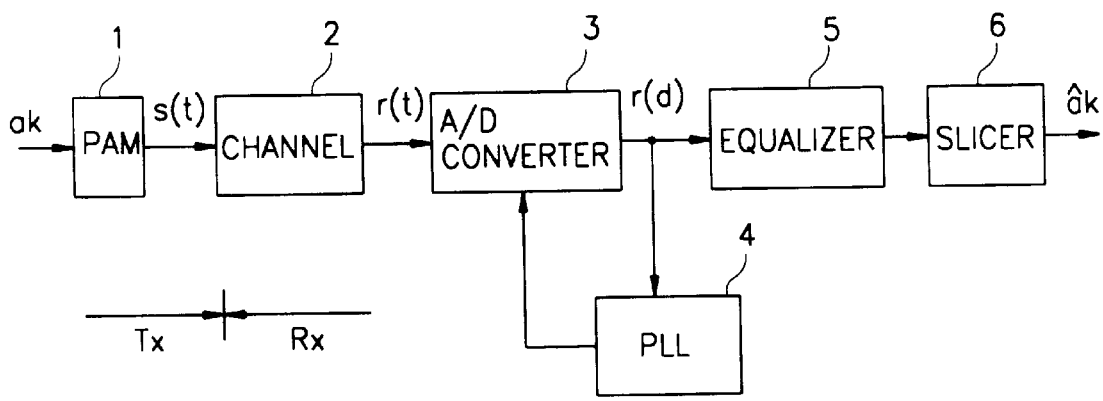
FIG. 1 is a schematic block diagram of a band-based PAM-type communication system according to the conventional art.
Figure 2:
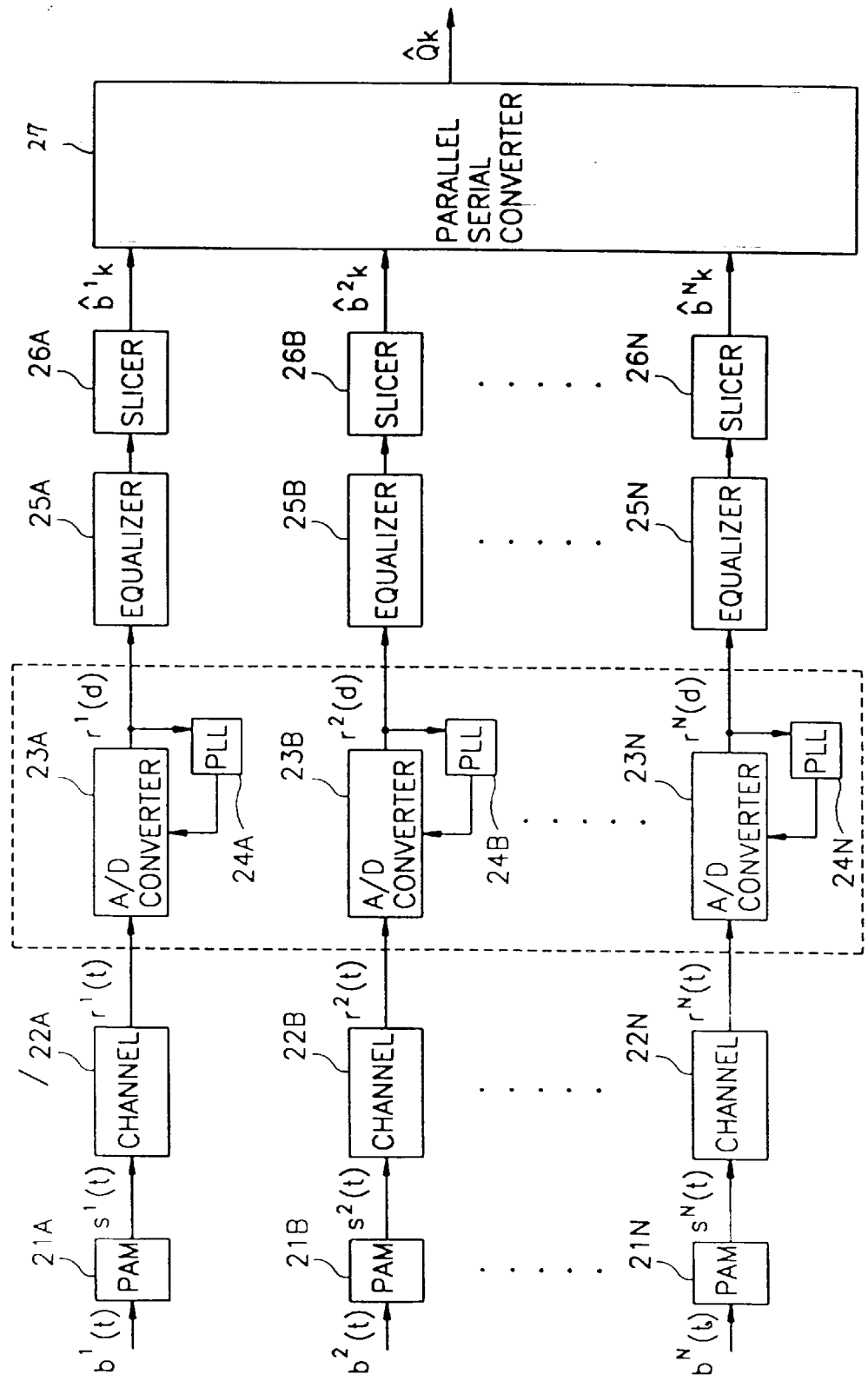
FIG. 2 is a schematic block diagram of a band-based PAM-type communication system having a plurality of channels according to the conventional art.
Figure 3:
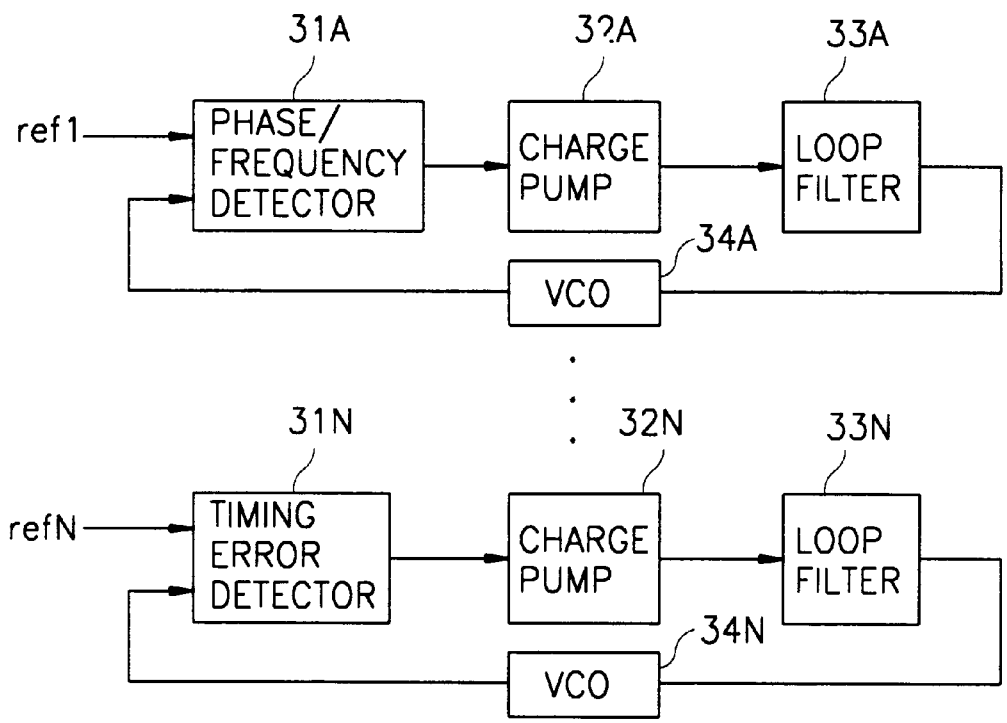
FIG. 3 is a detailed schematic block diagram of each PLL in the system of FIG. 2.
Figure 4:
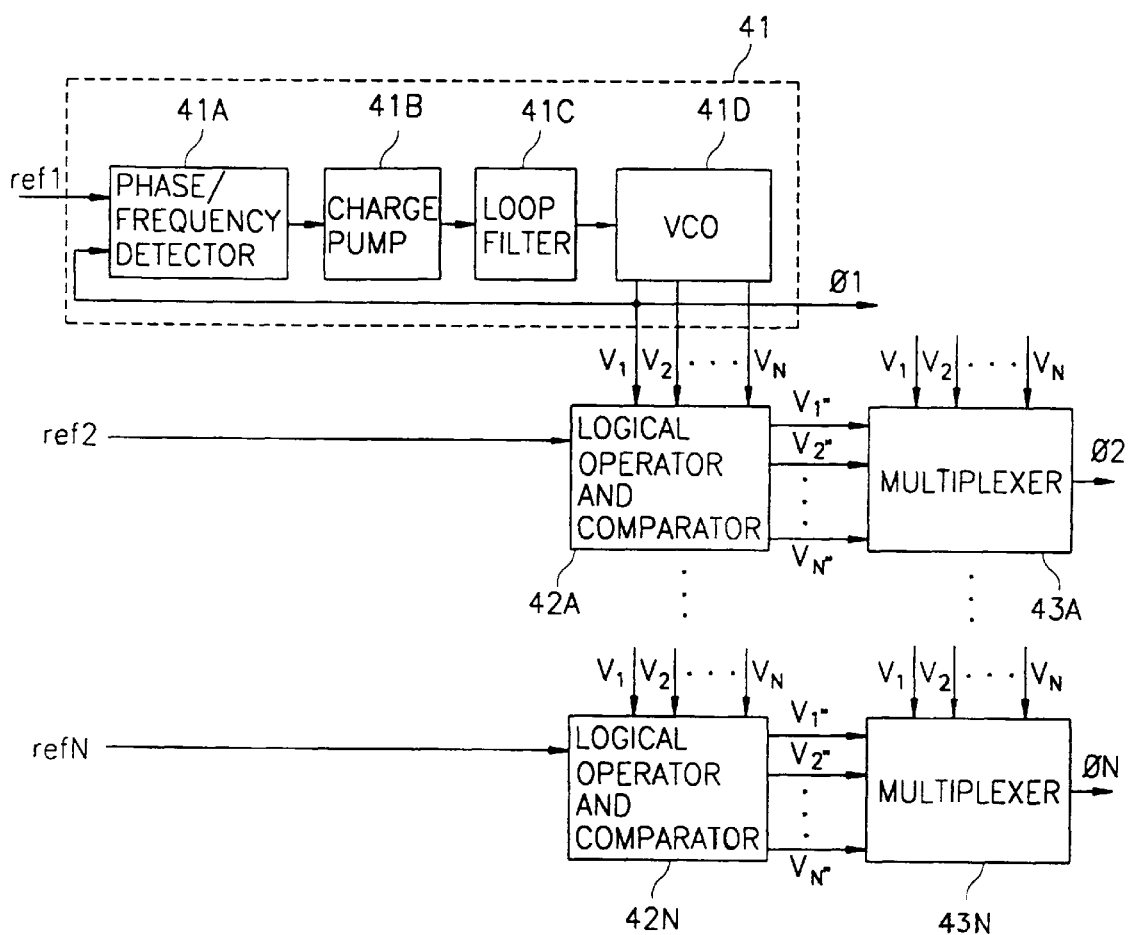
FIG. 4 is an exemplary schematic block diagram of a timing restoration circuit for a PAM-type communication system according to the present invention.

As shown in FIG. 4, a pulse amplitude modulation (PAM) type communication system has N communication channels through which respectively received signals $r^1(t)$–$r^N(t)$ are digitalized by an analog-to-digital (A/D) converter at a receiving side to yield respective corresponding first to Nth channel signals $ref_1$–$ref_N$. A timing restoration circuit according to the present invention includes a PLL 41 for phase correcting a square waveform signal to correspond to a received signal ($ref_1$) from the A/D converter of a receiving side to a fed-back input signal thereto and to output a sampling pulse signal ($\phi_1$) of a first channel and for sequentially delaying the same for a predetermined time to output signals $V_1$–$V_n$. Logical operator and comparator circuits 42A are included for logically operating and comparing the signals ($V_1$–$V_N$) generated in the PLL 41 with the received signal ($ref_2$) and generating selective control signals ($V_1''$–$V_N''$) for selecting a signal among the signals ($V_1$–$V_N$) closest to a timing of the received signal ($ref_2$). Multiplexer 43A is utilized for selecting a signal closest to the timing of the received signal ($ref_2$) among the output signals ($V_1$–$V_N$) from the PLL 41 on the basis of the selective control signals ($V_1''$–$V_N''$) and outputting the selected signal as the sampling pulse signal ($\phi_2$) of the second channel. Logical operators and comparators 42B–42N and multiplexers 43B–43N output sampling pulse signals ($\phi_3$–$\phi_N$) of the third to Nth channels, which perform the same function as the logical operator and comparator 42A and the multiplexer 43A upon the signals ($V_1$–$V_N$) sequentially delayed in the PLL 41 and the received signals ($ref_3$–$ref_N$) from each channel.

The operation and effect of the present invention will now be described in detail, referring to FIGS. 4 through 7.

The signals $S_1(t), S_2(t), \ldots, S_N(t)$ outputted to each channel from the transmission side are transmitted in parallel with a regular time interval (that is, a symbol period). Here, it is assumed that signals sequentially inputted through each channel from the receiving side are called RX1–RXN and the received signals ($ref_1$–$ref_N$) outputted from the A/D converter have the same frequency as the signals RX1–RXN but are delayed relative thereto.

The received signal ($ref_1$) outputted from the A/D converter at the receiving side is transmitted to the PLL 41 so that its phase/frequency difference with the signal from VCO 41D is detected in the PFD 41A. Then, the charge pump 41B pumps a charge corresponding to the value of the phase/frequency difference, and the level of a voltage corresponding to the phase/frequency difference is outputted and the noise is eliminated therefrom by the loop filter 41C that provides inputs to the VCO 41D.

Here, the VCO 41D generates a square waveform signal ($V_1$) having a frequency corresponding to the inputted voltage ref 1 to supply as a feed-back input to the PFD 41A and to output as the sampling pulse signal ($\phi_1$) synchronized with the corresponding symbol timing. The VCO 41D sequentially delays and outputs the square waveform signal ($V_1$) for a predetermined time as signals $V_2$–$V_N$. FIGS. 6B through 6I show the timings of the signals delayed and outputted from the VCO 41D, and FIG. 6A shows the timing of the received signal ($ref_2$).

As described above, the sampling pulse signal ($\phi_1$) of the first channel is outputted through the VCO 41D in the PLL 41, but the sampling pulse signals ($\phi_2$–$\phi_N$) of the other channels are not outputted through each separately-arranged VCO, but rather through each channel's respective logical operator and comparator 42A–42N and each channel's respective multiplexer 43A–43N.

Figure 5:
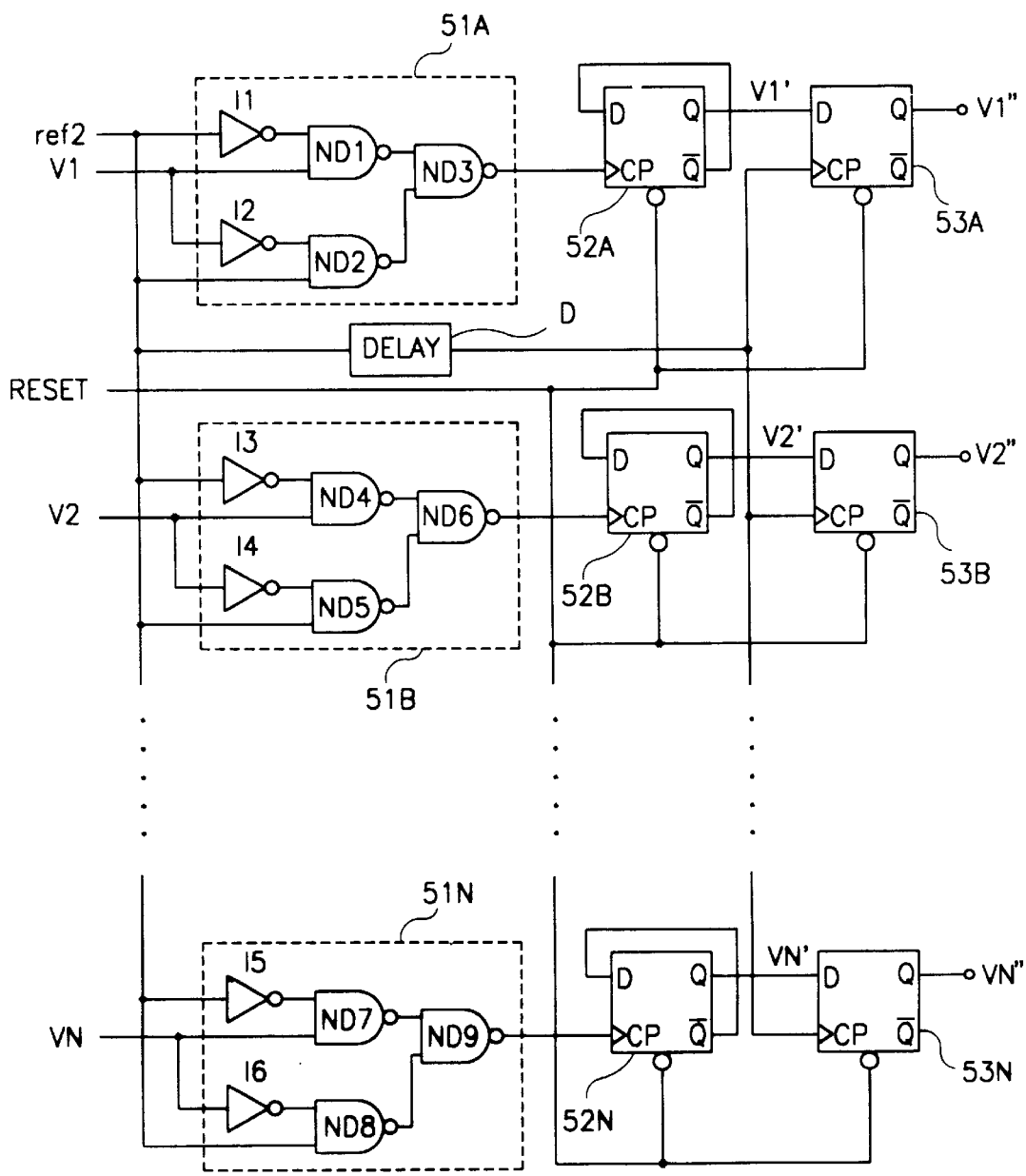
FIG. 5 is an exemplary detailed circuit diagram of a logical operator and comparator in the circuit of FIG. 4.

With reference to FIG. 5, explanation will be given of the outputting process of the sampling pulse signal ($\phi_2$) of the second channel.

First, after the received signal ($ref_2$) is inverted through an inverter (I1), it is applied to a NAND gate (ND1) to be combined with the output signal ($V_1$) from the VCO 41D shown in FIG. 6. Also, the received signal ($ref_2$) is applied directly to a NAND gate (ND2) to be combined with the output signal ($V_1$) from the VCO 41D applied thereto through an inverter (I2). The output signals from the NAND gates (ND1, ND2) are combined through a NAND gate (ND3) in a next stage, and applied to the clock pulse (CP) input of a D-type flip-flop 52A the (Q) output terminal of which is connected to its (D) input terminal, and from the (Q) output terminal of which is outputted the signal ($V_1'$), as shown in FIG. 7C.

The Q output signal ($V_1'$) from the D-type flip-flop 52A is applied to the (D) input of a D-type flip-flop 53A in a next stage, and the received signal ($ref_2$), as shown in FIG. 7A, is delayed through a delay (D) for a predetermined time, as shown in FIG. 7B, and then applied to the clock pulse (CP) input of the D-type flip-flop 53A. Here, since the signal ($V_1'$) is maintained to be "high" at the leading edge of the delayed received signal ($ref_2$), a selective control signal ($V_1''$), representing a logic "1", is outputted from the Q output of flip-flop 53A, as shown in FIG. 7K.

Similarly, the delayed output signal ($V_2$) from the VCO 41D shown in FIG. 6C and the received signal ($ref_2$), as shown in FIG. 7A, are logically operated in a logical operator 51B, and then the resultant signal is applied to the clock pulse (CP) input of a D-type flip-flop 52B. Then, a signal ($V_{2'}$), as shown in FIG. 7D, is outputted from the (Q)

output terminal of flip-flop 52B, and is inputted to the D input of a D-type flip-flop 53B in the next stage. Here, since the signal ($V_2''$) is maintained "high" at the leading edge of the delayed received signal ($ref_2$), as shown in FIG. 7B, applied to the clock pulse (CP) input of the flip-flop 53B, a selective control signal ($V_2''$), representing a logic "1", is outputted from the Q output of flip-flop 53B, as shown in FIG. 7L.

Similarly, output signals ($V_3$–$V_8$), from the VCO 41D, are logically operated on by respective logical operators 51C–51H for each respective corresponding received signal, and then the logical resultant signals are applied to the respective clock pulse (CP) inputs of the D-type flip-flops 52C–52H, and therefrom signals ($V_3'$–$V_8'$) shown in FIG. 7E through 7J are respectively outputted. Then the signals ($V_3'$–$V_8'$) are respectively inputted to D-type flip-flop 53C–53H in the last stage, and are compared and judged with the leading edge of the delayed received signal ($ref_2$) shown in FIG. 7B, and finally, selective control signals ($V_3''$–$V_8''$) shown in FIGS. 7M through 7R are respectively outputted.

The logical operators and comparators 42A logically operate the signals ($V_1$–$V_8$) shown in FIGS. 6B through 6I outputted from the VCO 41D with the received signal ($ref_2$) to generate the signals ($V_1'$–$V_8'$) shown in FIGS. 7C through 7J, and respectively compare them with the leading edge of the delayed received signal ($ref_2$), as shown in FIG. 7B, to output selective control signals ($V_1''$–$V_8''$), as shown in FIGS. 7K through 7R.

The multiplexer 43A scans the selective control signals ($V_1'$–$V_8'$) from the compare and logic operator 42A to determine which signal is first outputted at a low level, and selects a corresponding signal from the signals ($V_1$–$V_8$) as the sampling pulse signal ($\phi_2$) of the second channel. For example, since the selective control signal ($V_4''$) among the selective control signals ($V_1''$–$V_8''$), as shown in FIGS. 7K through 7R, is first outputted at a low level, the signal ($V_4$) is selected among the signals ($V_3$–$V_8$), as shown in FIGS. 6B through 6I, outputted from the VCO 41D to be outputted as the sampling pulse signal ($\phi_2$) of the second channel. As a reference, as shown in FIG. 7A and 7F, the received signal ($ref_2$) and the signal ($V_4$) have identical timing sequence, but are inverted in shape relative to one another.

The multiplexer 43A selects and outputs the signal among the signal ($V_1$–$V_8$) which most similarly corresponds to the timing sequence of the received signal ($ref_2$) on the basis of the selective control signals ($V_1''$–$V_8''$). For enhancing the accuracy, the number of bits of each signal ($V_1$–$V_8$) ($V_1'$–$V_8'$)($V_1''$–$V_8''$) has only to be increased.

Similarly, the other logical operators and comparators (42B–42N) logically operate and compare the received signals ($ref_3$–$ref_N$) with the output signals ($V_1$–$V_8$) from the VCO 41D, as in the logical operator and comparator 42A, to generate the selective control signals ($V_1''$–$V_8''$). On this basis, a signal among the output signals ($V_1$–$V_8$) from the VCO 41D which most similarly corresponds to the timing sequence of the received signals ($ref_3$–$ref_N$) is selected, to output as the respective sampling pulse signal ($\phi_2$–$\phi_N$) of the second through N channels, respectively.

As described in detail above, a PAM-type timing restoration circuit according to the present invention effectively prevents an interference caused by the use of a plurality of VCOs by restoring the timing of a sampling pulse signal required in each channel with only one PLL circuit and a plurality of logical operators and comparators corresponding to the number of channels, to stabilize the communication system and make feasible its higher integration, due to the use of only one VCO.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. A pulse amplitude modulation (PAM) type communication system having N communication channels through which respectively received signals $r^1(t)$–$r^N(t)$ are in turn analog-to-digital (A/D) converted at a receiving side to yield respective corresponding first to Nth channel signals $ref_1$–$ref_N$, having a timing restoration circuit comprising:
   a phase locked loop (PLL) for receiving a first channel signal $ref_1$, for generating oscillatory signal $V_1$ corresponding with the first channel signal $ref_1$, for outputting the signal $V_1$ as a sampling pulse signal $\emptyset_1$ of a first channel, and for sequentially delaying the signal $V_1$ for a predetermined times to generate and output a plurality of respective sequentially delayed oscillatory signals $V_2$–$V_N$; and
   a plurality of pulse output samplers responsive to the sequentially delayed oscillators $V_1$–$V_N$ for respectively outputting sampling pulse signals $\emptyset_2$–$\emptyset_N$ of second through Nth channels, whereby interference caused by use of a plurality of PLLs is avoided.

2. The pulse amplitude modulation (PAM) type communication system according to claim 1, wherein each of the pulse output samplers further comprises:
   a logical operator and comparator for logically operating and comparing each of second through Nth channel signals $ref_2$–$ref_N$ with each of the oscillatory signals $V_1$–$V_N$ outputted from the PLL and generating selective control signals $V_1''$–$V_N''$ for selecting a signal among the oscillatory signals $V_1$–$V_N$ which is closest in timing to each of the respective second through Nth channel signals $ref_2$–$ref_N$; and
   a multiplexer, in accordance with the selective control signals $V_1''$–$V_N''$ from the logical operator and comparator, for selecting the signals among the oscillatory signals $V_1$–$V_N$ outputted from the PLL which are closest in timing to each of the respective second through Nth channel signals $ref_2$–$ref_N$ and outputting the selected signals as the sampling pulse signals $\emptyset_2$–$\emptyset_N$ of the second through Nth channels, respectively.

3. The pulse amplitude modulation (PAM) type communication system according to claim 2, wherein each of the logical operators and comparators comprises:
   a first through Nth first inverter for inverting a corresponding one of the second through Nth channel signals $ref_2$–$ref_N$;
   a first through Nth second inverter for inverting a respective one of the oscillatory signals $V_1$–$V_N$ outputted from the PLL;
   a delay for delaying the corresponding one of the second through Nth channel signals $ref_2$–$ref_N$;
   a first through Nth first NAND gate for combining an output signal from a corresponding one of the first through Nth first inverter with a respective one of the oscillatory signals $V_1$–$V_N$;
   a first through Nth second NAND gate for combining an output signal from a corresponding second inverter with the corresponding one of the channel signals $ref_2$–$ref_N$;

a first through Nth third NAND gate for combining an output signal from a corresponding one of the first NAND gates with an output signal from a corresponding one of the second NAND gates;

a first through Nth first D-flip/flop receiving at a clock pulse input terminal thereof an output signal from a corresponding one of the third NAND gates, and having a Q output terminal thereof connected to a D input terminal thereof; and a first through Nth second D-flip/flop receiving at a clock pulse input terminal one of the sequentially delayed oscillatory signals $V_2$–$V_N$ receiving at a D input terminal thereof an output signal from a Q output terminal of a corresponding one of the first D-flip/flops, and each respectively outputting at a Q output terminal thereof a respective one of the selective control signals $V_1"$–$V_N"$.

4. The pulse amplitude modulation (PAM) type communication system according to claim 2, wherein each of the oscillatory signals $V_1$–$V_N$ is a square wave.

5. The pulse amplitude modulation (PAM) type communication system according to claim 2, wherein the oscillatory signal $V_1$ corresponds in phase and frequency to the first channel signal $ref_1$.

6. The pulse amplitude modulation (PAM) type communication system according to claim 2, wherein there are a N–1 pulse output samplers.

7. The pulse amplitude modulation (PAM) type communication system according to claim 3, wherein each of the oscillatory signals $V_1$–$V_N$ is a square wave.

8. The pulse amplitude modulation (PAM) type communication system according to claim 3, wherein the oscillatory signal $V_1$ corresponds in phase and frequency to the first channel signal $ref_1$.

9. The pulse amplitude modulation (PAM) type communication system according to claim 3, wherein there are a N–1 pulse output samplers.

10. The pulse amplitude modulation (PAM) type communication system according to claim 1, wherein each of the logical operators and comparators comprises:

a first through Nth first inverter for inverting a corresponding one of the second through Nth channel signals $ref_2$–$ref_N$;

a first through Nth second inverter for inverting a respective one of the oscillatory signals $V_1$–$V_N$ outputted from the PLL;

a delay for delaying the corresponding one of the second through Nth channel signals $ref_2$–$ref_N$;

a first through Nth first NAND gate for combining an output signal from a corresponding one of the first through Nth first inverter with a respective one of the oscillatory signals $V_1$–$V_N$;

a first through Nth second NAND gate for combining an output signal from a corresponding second inverter with the corresponding one of the channel signals $ref_2$–$ref_N$;

a first through Nth third NAND gate for combining an output signal from a corresponding one of the first NAND gates with an output signal from a corresponding one of the second NAND gates;

a first through Nth first D-flip/flop receiving at a clock pulse input terminal thereof an output signal from a corresponding one of the third NAND gates, and having a Q output terminal thereof connected to a D input terminal thereof; and a first through Nth second D-flip/flop receiving at a clock pulse input terminal one of the sequentially delayed oscillatory signals $V_2$–$V_N$ receiving at a D input terminal thereof an output signal from a Q output terminal of a corresponding one of the first D-flip/flops, and each respectively outputting at a Q output terminal thereof a respective one of the selective control signals $V_1"$–$V_N"$.

11. The pulse amplitude modulation (PAM) type communication system according to claim 10, wherein each of the oscillatory signals $V_1$–$V_N$ is a square wave.

12. The pulse amplitude modulation (PAM) type communication system according to claim 10, wherein the oscillatory signal $V_1$ corresponds in phase and frequency to the first channel signal $ref_1$.

13. The pulse amplitude modulation (PAM) type communication system according to claim 10, wherein there are a N–1 pulse output samplers.

* * * * *